United States Patent
Abadeer et al.

(10) Patent No.: US 9,263,517 B2
(45) Date of Patent: Feb. 16, 2016

(54) EXTREMELY THIN SEMICONDUCTOR-ON-INSULATOR (ETSOI) LAYER

(71) Applicant: GLOBALFOUNDRIES INC., Grand Cayman (KY)

(72) Inventors: Wagdi W. Abadeer, Jericho, VT (US); Kiran V. Chatty, Oviedo, FL (US); Jason E. Cummings, Albany, NY (US); Toshiharu Furukawa, Essex Junction, VT (US); Robert J. Gauthier, Hinesburg, VT (US); Jed H. Rankin, Richmond, VT (US); Robert R. Robison, Colchester, VT (US); William R. Tonti, Essex Junction, VT (US)

(73) Assignee: GLOBALFOUNDRIES. INC., Grand Cayman (KY)

( * ) Notice: Subject to any disclaimer, the term of this patent is extended or adjusted under 35 U.S.C. 154(b) by 0 days.

(21) Appl. No.: 13/835,463

(22) Filed: Mar. 15, 2013

(65) Prior Publication Data

US 2013/0200486 A1     Aug. 8, 2013

Related U.S. Application Data

(62) Division of application No. 13/342,423, filed on Jan. 3, 2012, now abandoned.

(51) Int. Cl.
| | |
|---|---|
| H01L 21/70 | (2006.01) |
| H01L 29/06 | (2006.01) |
| H01L 21/762 | (2006.01) |
| H01L 21/84 | (2006.01) |
| H01L 27/12 | (2006.01) |

(52) U.S. Cl.
CPC ...... *H01L 29/0649* (2013.01); *H01L 21/76264* (2013.01); *H01L 21/84* (2013.01); *H01L 27/1203* (2013.01)

(58) Field of Classification Search
CPC .................................................. H01L 29/66621
USPC ......................................................... 257/507
See application file for complete search history.

(56) References Cited

U.S. PATENT DOCUMENTS

| | | |
|---|---|---|
| 5,154,023 A | 10/1992 | Sioshansi |
| 5,834,816 A | 11/1998 | Jang |
| 6,229,184 B1 | 5/2001 | Riccobene |
| 6,537,606 B2 | 3/2003 | Allen et al. |
| 6,551,886 B1 | 4/2003 | Yu |
| 6,599,840 B2 | 7/2003 | Wu et al. |
| 6,927,146 B2 | 8/2005 | Brask et al. |

(Continued)

OTHER PUBLICATIONS

U.S. Appl. No. 12/603,668, Office Action dated Apr. 2, 2014.

(Continued)

*Primary Examiner* — Andy Huynh
*Assistant Examiner* — Sitaramarao S Yechuri
(74) *Attorney, Agent, or Firm* — Anthony Canale; Hoffman Warnick LLC (57) ABSTRACT

Various aspects include extremely thin semiconductor-on-insulator (ETSOI) layers. In one embodiment, an ETSOI layer includes a plurality of shallow trench isolations (STI) defining a plurality of distinct semiconductor-on-insulator (SOI) regions, the distinct SOI regions having at least three different thicknesses; at least one recess located within the distinct SOI regions; and an oxide cap over the at least one recess.

12 Claims, 5 Drawing Sheets

(56) References Cited

U.S. PATENT DOCUMENTS

| | | |
|---|---|---|
| 7,087,475 B2 | 8/2006 | Inoh |
| 7,141,459 B2 * | 11/2006 | Yang et al. .............. 438/154 |
| 7,202,123 B1 | 4/2007 | Pan |
| 7,265,054 B2 | 9/2007 | Choi et al. |
| 7,320,929 B2 | 1/2008 | Aga et al. |
| 7,407,868 B2 | 8/2008 | Brask et al. |
| 7,767,583 B2 | 8/2010 | Ramappa et al. |
| 7,804,151 B2 | 9/2010 | Brown et al. |
| 2003/0235959 A1 | 12/2003 | Lichtenberger et al. |
| 2004/0121531 A1 | 6/2004 | Wieczorek et al. |
| 2004/0248348 A1 * | 12/2004 | Rausch et al. .............. 438/197 |
| 2006/0279844 A1 | 12/2006 | Maeno |
| 2007/0057307 A1 | 3/2007 | Shum et al. |
| 2007/0069335 A1 | 3/2007 | Endo et al. |
| 2007/0145481 A1 | 6/2007 | Tilke et al. |
| 2007/0177874 A1 | 8/2007 | Kashima et al. |
| 2007/0277874 A1 | 12/2007 | Dawson-Elli et al. |
| 2007/0281105 A1 | 12/2007 | Mokhlesi et al. |
| 2008/0299686 A1 | 12/2008 | Kobayashi et al. |
| 2011/0095366 A1 | 4/2011 | Abadeer et al. |
| 2011/0095393 A1 | 4/2011 | Berliner et al. |
| 2011/0097824 A1 | 4/2011 | Berliner et al. |
| 2012/0098087 A1 | 4/2012 | Abadeer et al. |

OTHER PUBLICATIONS

U.S. Appl. No. 12/603,668, filed Oct. 22, 2009, Office Action dated Nov. 1, 2011.

U.S. Appl. No. 12/603,671, filed Oct. 22, 2009, Notice of Allowance and Fees Due dated Oct. 11, 2011.

U.S. Appl. No. 12/603,737, filed Oct. 22, 2009, Notice of Allowance and Fees Due dated Oct. 5, 2011.

U.S. Appl. No. 12/603,737, filed Oct. 22, 2009, Office Action dated Jul. 12, 2011.

U.S. Appl. No. 12/603,668, filed Oct. 22, 2009, Office Action dated Jun. 27, 2011.

U.S. Appl. No. 12/603,671, filed Oct. 22, 2009, Office Action dated May 12, 2011.

U.S. Appl. No. 12/603,737, filed Oct. 22, 2009, Office Action dated Jan. 6, 2011.

U.S. Appl. No. 12/603,668, filed Oct. 22, 2009, Office Action dated Dec. 23, 2010.

Eryu et al., "Nanostructure formation of SiC using ion implantation and CMP" Nuclear Instruments and Methods in Physics Research B 242 (2006) 237-239.

Allen et al., "SOI Uniformity and Surface Smoothness Improvement Using GCIB Processing", 2002 IEEE International SOI Conference, Oct. 2002.

U.S. Appl. No. 12/603,668, filed Oct. 22, 2009, Office Action dated Mar. 29, 2012.

U.S. Appl. No. 12/603,668, filed Oct. 22, 2009, Office Action dated Jul. 26, 2012.

U.S. Appl. No. 13/342,423, filed Jan. 3, 2012, Office Action dated Nov. 26, 2012.

U.S. Appl. No. 13/342,423, filed Jan. 3, 2012, Office Action dated Aug. 16, 2012.

Vu, David, U.S. Appl. No. 12/603,668, Final Office Action dated Jul. 25, 2014, 10 pgs.

Luu, Chuong A., U.S. Appl. No. 13/359,970, Notice of Allowance, Sep. 15, 2014, 8 pgs.

Luu, Chuong A., U.S. Appl. No. 13/359,970, Office Action, May 9, 2014, 9 pgs.

U.S. Appl. No. 12/603,668, "Notice of Allowance," Dec. 17, 2014, 16 pgs.

U.S. Appl. No. 13/835,463, Appendix P, "List of IBM Patents or Patent Applications Treated as Related," 2 pgs, 2014.

* cited by examiner

EXTREMELY THIN SEMICONDUCTOR-ON-INSULATOR (ETSOI) LAYER

CROSS-REFERENCE TO RELATED APPLICATIONS

This application is a divisional of co-pending U.S. patent application Ser. No. 13/342,423, filed Jan. 3, 2012, and incorporated by reference herein in its entirety.

BACKGROUND

The subject matter disclosed herein relates to solutions for thinning semiconductor-on-insulator (SOI) layers in a semiconductor device. Specifically, the subject matter disclosed herein relates to solutions for forming extremely-thin semiconductor-on-insulator (ETSOI) wafers including at least one recess.

Complementary metal-oxide semiconductor (CMOS) devices built on an extremely (see also, extra) thin semiconductor-on-insulator (SOI) substrate have been one of the viable options for continued scaling of CMOS technology to the 22 nm node and beyond. Device characteristics such as threshold voltage (Vt) of an extra-thin SOI (ETSOI) device are partially determined by the thickness of the ETSOI. Consequently, controlling SOI thickness within a wafer helps prevent undesirable Vt variation. For the 22 nm node and beyond, the SOI thickness requirement may be about 10 nm or thinner. Currently, SOI wafers are generated having thicknesses that are significantly thicker than 60 nm, and are then thinned to the ETSOI level. One current wafer thinning technique includes a series of oxidation and etching steps, performed successively, over the course of one week to ten days. This technique, like others not discussed for the purposes of clarity, can be costly and time-intensive.

BRIEF DESCRIPTION

Solutions for forming an extremely thin semiconductor-on-insulator (ETSOI) layer in a semiconductor device are disclosed. In one aspect, a method of forming an ETSOI layer is disclosed, the method including: providing a wafer including a plurality of semiconductor-on-insulator (SOI) layer regions separated by at least one shallow trench isolation (STI); forming a mask over a first one of the plurality of SOI layer regions, the mask exposing at least one of the SOI layer regions distinct from the first region; amorphizing the at least one exposed SOI layer region by implanting the at least one exposed SOI layer region with an implant species; removing the mask after the amorphizing; and removing a portion of the amorphized SOI layer to form a recess.

A first aspect provides a method including: providing a wafer including a plurality of semiconductor-on-insulator (SOI) layer regions separated by at least one shallow trench isolation (STI); forming a mask over a first one of the plurality of SOI layer regions, the mask exposing at least one of the SOI layer regions distinct from the first region; amorphizing the at least one exposed SOI layer region by implanting the at least one exposed SOI layer region with an implant species; removing the mask after the amorphizing; and removing a portion of the amorphized SOI layer to form a recess.

A second aspect provides a method including: providing a wafer including a plurality of semiconductor-on-insulator (SOI) layer regions separated by at least one shallow trench isolation (STI); amorphizing the plurality of SOI layer regions by implanting the plurality of SOI layer regions with an implant species; and removing a portion of the amorphized SOI layer region to form at least one recess.

A third aspect provides an extremely-thin semiconductor-on-insulator (ETSOI) layer including: a plurality of shallow trench isolations (STI) defining a plurality of distinct semiconductor-on-insulator (SOI) regions, the distinct SOI regions having at least three different thicknesses; at least one recess located within the distinct SOI regions; and an oxide cap over the at least one recess; wherein the at least three different thicknesses include: a first thickness of approximately 60-100 angstroms, a second thickness of approximately 25-60 angstroms, and a third thickness of approximately 5-25 angstroms.

A fourth aspect includes an extra-thin semiconductor-on-insulator (ETSOI) layer including: a plurality of shallow trench isolations (STI) defining a plurality of distinct semiconductor-on-insulator (SOI) regions, the distinct SOI regions having at least three different thicknesses; at least one recess located within the distinct SOI regions; and an oxide cap over the at least one recess.

A fifth aspect includes an extra-thin semiconductor-on-insulator (ETSOI) layer including: a plurality of shallow trench isolations (STI) defining a plurality of distinct semiconductor-on-insulator (SOI) regions, the distinct SOI regions having at least three different average thicknesses; at least one recess located within the distinct SOI regions; and an oxide cap over the at least one recess, wherein the at least three different average thicknesses include: a first average thickness of approximately 60-100 angstroms, a second average thickness of approximately 25-60 angstroms, and a third average thickness of approximately 5-25 angstroms.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
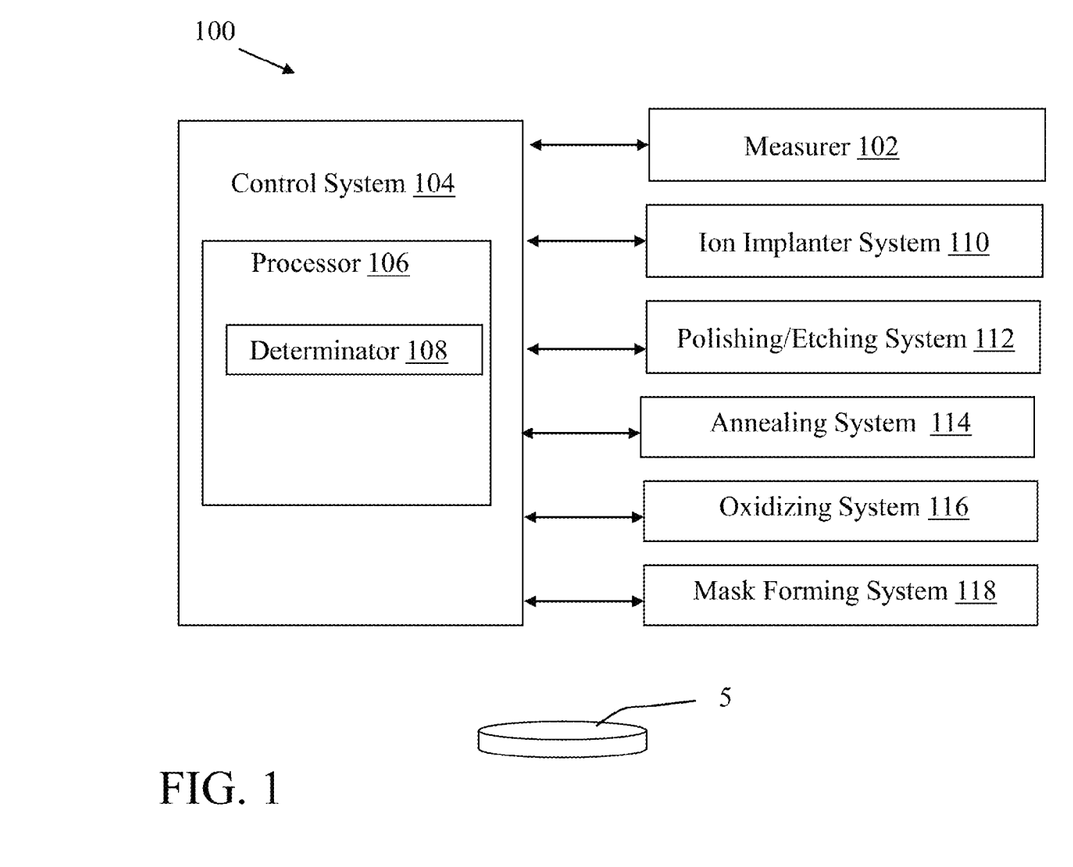
FIG. 1 shows a block diagram of a system according to embodiments of the invention.

Referring to the drawings, FIG. 1 shows a block diagram of a system 100 according to embodiments of the invention. System 100 includes a measurer 102, a control system 104 including a processor 106, an ion implanter system 110, a polishing/etching system 112, an annealing system 114, an oxidizing system 116 and a mask forming system 118.

Measurer 102 may include any now known or later developed system for measuring the topography of a surface, such as a semiconductor structure 5, and obtaining a semiconductor layer thickness at a plurality of selected points on structure 5. For example, measurer 102 may include an interferometry-based device such as ellipsometry or a scanning microscope such as a scanning electron microscope (SEM) or atomic force microscope (AFM), etc. Ion implanter system 110 may include any now known or later developed ion implanter system capable of dynamically controlled, across-wafer energy or dose (scan speed) variation, e.g., an infusion gas cluster ion implanter system or a spot beam ion implanter system. Illustrative ion implanter systems that may be capable of such functioning include, but are not limited to: a Quantum X model (scanning ion beam) available from Applied Materials of Santa Clara, Calif., a Varian 900XP available from Varian Semiconductor Equipment of Gloucester, Mass. and an Axcelis Optima HD available from Axcelis Corp. of Beverly, Mass. Each of the above-listed ion implanter systems may require some control system modifications to allow control based on a removal thickness data, e.g., in the form of a topographical map, as will be described in greater detail herein. Polishing/etching system 112 may include any now known or later developed system capable of removing layers of solid by chemical mechanical polishing (CMP) and/or reactive ion etching (RIE) carried out for the purpose of, e.g., surface planarization and definition of metal interconnect patterns.

System 100 also includes a control system 104 for controlling measurer 102, ion implanter system 110, polishing/etching system 112, annealing system 114, oxidizing system 116, mask forming system 118 and any interconnecting systems, either directly or through interaction with internal controllers of those components. Control system 104 may include any now known or later developed processor-based machine control system. In addition, processor 106 includes a determinator 108, the function of which will be described in greater detail elsewhere herein.

As will be appreciated by one skilled in the art, control system 104 may be embodied as a system or computer program product. Accordingly, control system 104 may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, control system 104 may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of control system 104 may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Operation of control system 104 is described with reference to the other figures that illustrate methods, apparatus (systems) and computer program products according to embodiments of the invention. It will be understood that control of measurer 102, ion implanter system 110, polishing/etching system 112, annealing system 114, oxidizing system 116 and mask forming system 118, processor 106 and any other systems or functions necessary for operation of system 100 may be implemented by computer program instructions. These computer program instructions may be provided to a processor (e.g., 106) of a general purpose computer, special purpose computer, or other programmable data processing apparatus to produce a machine, such that the instructions, which execute via the processor of the computer or other programmable data processing apparatus, create means for implementing the functions/acts specified herein.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2A:
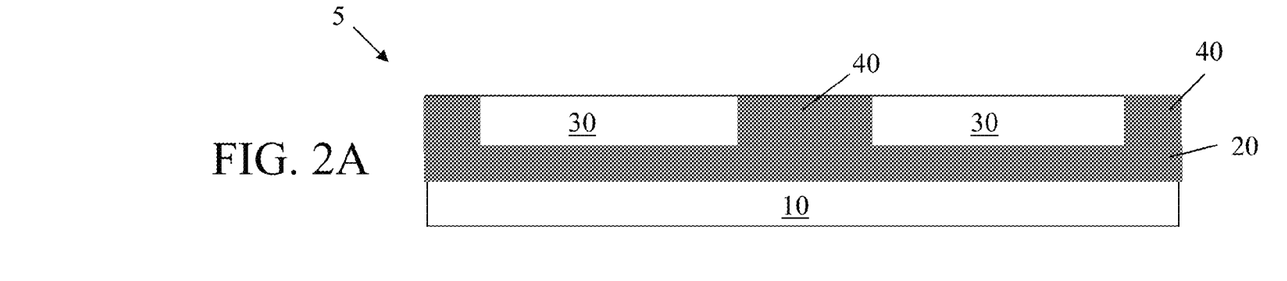
FIGS. 2A-2C illustrate processes in formation of extremely-thin semiconductor-on-insulator (ETSOI) wafers according to embodiments of the invention.

Turning to FIG. 2A, a semiconductor structure 5 is shown including a substrate layer 10, a buried insulator layer 20, and a semiconductor-on-insulator (SOI) layer 30. Semiconductor structure 5 is further shown including at least one shallow trench isolation (STI) 40. As is understood in the art of semiconductor manufacturing, substrate layer 10 and SOI layer 30 may include, but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire layer may be strained. Buried insulator layer 20 may include any dielectric material typically used in a semiconductor structure, e.g., a silicon dioxide. It is understood that semiconductor structure 5 includes at least one STI 40, which may be formed according to known methods. For example, STI 40 and SOI layer 30 may be formed by etching trenches (not shown) in buried insulator layer 20, filling those trenches with SOI layer 30, and using chemical-mechanical planarization (CMP) to remove excess SOI layer 30. As is known in the art of semiconductor manufacturing, STI 40 may be used to prevent electrical current leakage between adjacent semiconductor components. In any case, as shown in FIG. 2A, plurality of SOI layer regions 30 are separated by at least one STI 40.

In one embodiment of the invention, in a preliminary processing step, measurer 102 measures a semiconductor layer thickness at a plurality of selected points on a semiconductor structure 5. The number of selected points (or granularity) at which the measurements are made can be user defined, e.g., depending on the size of the wafer or the thickness precision required. The thickness of SOI layer region 30 can be determined by measurer 102 using any known technique (e.g., ellipsometry, interferometry, microscopic scanning, etc.) and related computational functions (e.g., determining thickness of a layer from a known reference point or base line). In one embodiment, the reference point may be the interface between buried insulator layer 20 and SOI layer region 30 to a top surface of SOI layer region 30 measured along a line that is substantially orthogonal to the interface.

In a second preliminary process, determinator 108 (FIG. 1) determines a removal thickness to be removed at each of the plurality of selected points (e.g., within SOI layer region 30) such that removal of the removal thickness creates at least one recess. In one embodiment, determinator 108 may express the removal thicknesses across semiconductor structure 5 as a topographical map (not shown), as is known in the art.

Figure 2B:
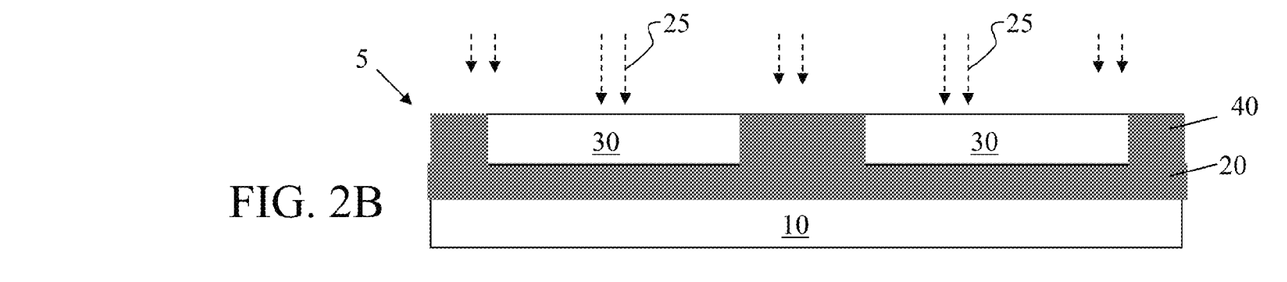

Turning to FIG. 2B, in a first processing step, ion implanter system 110 is used to implant semiconductor structure 5 with an implant species 25. Ion implanter system 110 may implant species 25 at each of a plurality of selected points with at least one dose level and energy level based upon the desired removal thickness for that point. As is understood, ion implanter system 110 may require some modifications via its control system in order for it to be controlled based on the removal thickness; however, such modifications are well within the purview of a skilled artisan. For example, modification of a wafer scanning controller or a beam or spot scanning controller may be required for controlling dose, and modifications of a source extraction voltage controller, an analyzer magnet controller, a beamline optics controller, etc., may be required for controlling energy. Other equipment may also need to be added, e.g., an ion deceleration electrode adjacent to an end of the beamline for controlling ion energy.

Implant species 25 may include any element(s) that increases the polishing/etching rate of the semiconductor layer. Implant species 25 may include, for example, one or more of silicon (Si), germanium (Ge), xenon (Xe) and argon (Ar). The dose level and/or energy level may be dynamically varied during the scanning of an ion beam (not shown) across semiconductor structure 5. In this fashion, the dose level and/or energy level is made higher for points at which the removal thickness is greater, and is made lower at points at which the removal thickness is lower. Any suitable implantation dose and implantation energy levels may be used within the scope of the invention. For example, depending on the implanted ions and the implantation angle, the ion implanter system 110 may use an implant energy within a range from about 2 kilo-electron volts (KeV) to about 800 KeV, with a preferred range being from about 10 KeV to about 200 KeV, and a most preferred range being from about 30 KeV to about 60 KeV. The dose of the amorphizing ions being implanted may vary depending on the type of amorphized ion being implanted. Typically, the dose of the implanted amorphizing ion is from about $1\times10^{13}$ atoms/$cm^2$ to about $5\times10^{15}$ atoms/$cm^2$, with a dose from about $5\times10^{13}$ atoms/$cm^2$ to about $1\times10^{15}$ atoms/$cm^2$ being even more typical. In one embodiment, the implant species is Xe and is implanted with a dose of approximately $3\times10^{14}$ atoms/$cm^2$ and an implant energy of approximately 20-30 KeV. More specifically, Xe may be implanted at an implant energy of approximately 25 KeV. In another embodiment, the implant species is Si, and the implant energy may be approximately 10-20 KeV. More specifically, Si may be implanted at an implant energy of approximately 16.5 KeV. In another embodiment, the implant species is Ge and is implanted with an implant energy of approximately 20-30 KeV. More specifically, Ge may be implanted at an implant energy of approximately 26 KeV. In any case, implanting of semiconductor structure 5 may cause SOI layer regions 30 to amorphize. As used herein, the term "amorphize" refers to the transformation of a crystalline structure into a non-crystalline structure. For example, during amorphization, portions of SOI layer regions 30 are transformed from a crystalline solid state into a non-crystalline solid state. In one embodiment, using the above-described techniques, SOI layer region 30 is amorphized such that its defect concentration is greater than approximately 10%. In any case, the amorphous depth may reach approximately 10-70 nanometers, and preferably, approximately 50-65 nanometers (where, e.g., a starting wafer thickness may be approximately 80-90 nanometers), allowing for amorphization of a portion of SOI layer region 30 and aiding in formation of one or more recesses.

Figure 2C:
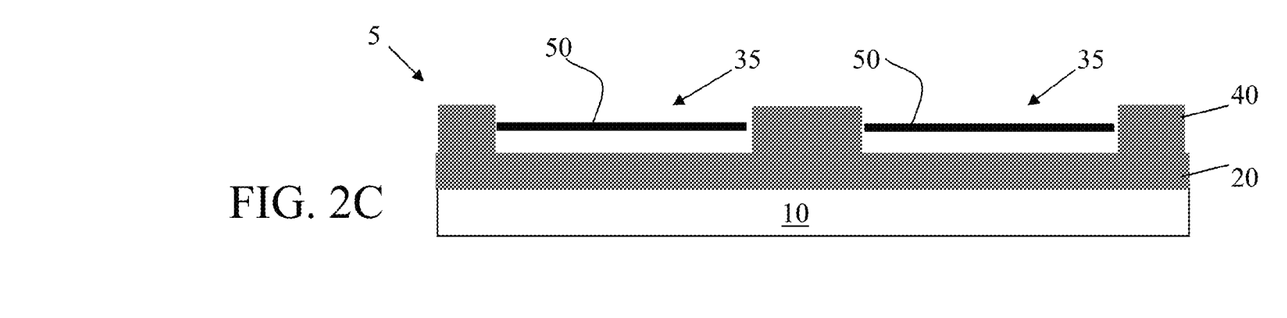

Turning to FIG. 2C, semiconductor structure 5 is shown after polishing/etching system 112 has removed a portion of the amorphized SOI layer region 30 and formed at least one recess 35. Further shown in FIG. 2C is an oxide cap 50 formed over the SOI layer region 30 in recess 35. Polishing/etching system 112 may remove a portion of amorphized SOI layer region 30 using, for example, chemical-mechanical planarization (CMP). As is known in the art of semiconductor manufacturing, CMP may include, for example, use of an abrasive/corrosive chemical slurry (colloid) in conjunction with a polishing pad to remove material from a semiconductor wafer. In this case, CMP of SOI layer region 30 may be enhanced by its amorphous state, allowing for effective formation of recesses 35. In another embodiment, polishing/etching system 112 may remove a portion of amorphized SOI layer region 30 using reactive ion etching (RIE). As is known in the art of semiconductor fabrication, RIE uses chemically reactive plasma to remove material deposited on semiconductor wafers. In this case, RIE of SOI layer region 30 may be enhanced by its amorphous state, allowing for effective formation of recesses 35.

It is understood that CMP and/or RIE processes may be used in removing a portion of amorphized SOI layer region 30 to form recess 35. It is further understood that these processes may remove portions of STI 40, depending upon their degree of selectivity. Additionally, it is understood that either or both of these processes may cause damage to remaining portions (those not removed) of SOI layer region 30 and/or STI 40. Therefore, in one embodiment, after removing amorphized portions of SOI layer region 30, annealing system 114 may anneal semiconductor structure 5 to heal damage caused by subsequent processing steps. Annealing system 114 may be any system capable of providing a heat treatment causing changes (e.g., diffusion of atoms within a solid) in material properties such as strength and hardness. In this case, annealing may be performed by any conventional means, e.g., baking of semiconductor structure 5. After annealing, oxidizing system 116 may form an oxide cap 50 over remaining portions of SOI layer region 30 within recess 35. As is known in the art of semiconductor manufacturing, oxide cap 50 may be formed by oxidation of SOI layer region 30. Specific embodiments of annealing system 114 and oxidizing system 116, among others, will be apparent to those skilled in the art and have been omitted for clarity.

Figure 3A:
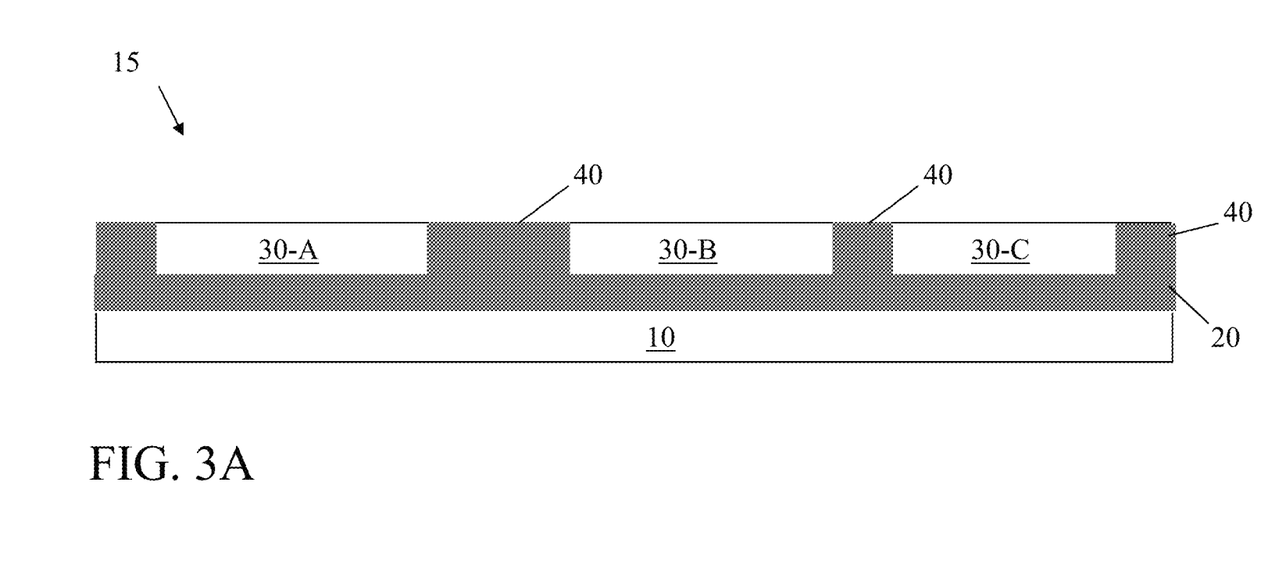
FIGS. 3A-3C illustrate processes in formation of extremely-thin semiconductor-on-insulator (ETSOI) wafers according to embodiments of the invention.

Turning to FIG. 3A, a semiconductor structure 15 is shown including a substrate layer 10, a buried insulator layer 20, and semiconductor-on-insulator (SOI) layer regions 30-A, 30-B, 30-C. Semiconductor structure 15 is further shown including at least one shallow trench isolation (STI) 40. Semiconductor structure 15 may be formed substantially similarly to semiconductor structure 5, shown and described with reference to FIG. 2A. The depiction of semiconductor structure 15 in FIG. 3A includes three (3) SOI layer regions 30-A, 30-B and 30-C (similar to SOI layer regions 30 of FIG. 2A), however, it is understood that semiconductor structure 15 and semiconductor structure 5 (FIG. 2A) may include any number of SOI layer regions 30. In a preliminary processing step, measurer 102 measures a semiconductor layer thickness at a plurality of selected points on a semiconductor structure 15, as similarly described with reference to FIG. 2A.

Figure 3B:
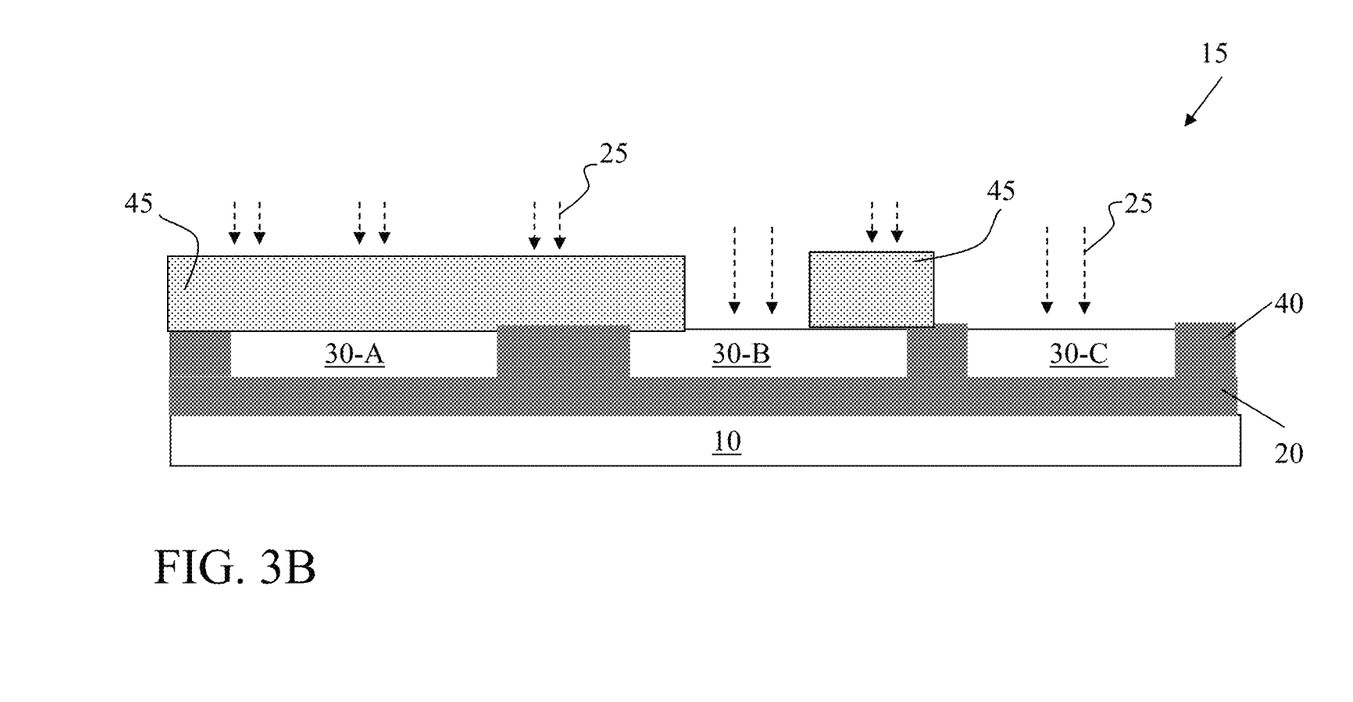

Turning to FIG. 3B, mask forming system 119 forms a mask 45 over semiconductor structure 15. Mask 45 may be formed of, for example, any mask material capable of protecting underlying materials from ion implantation or other amorphization-inducing processes. Mask forming system 119 may form mask 45 using any techniques described herein or know in the art, e.g., via deposition. In any case, mask 45 may be selectively formed over a first one of a plurality of SOI layer regions 30-A, while exposing at least one SOI layer region 30-C and 30-B (partially). After forming of mask 45, exposed portions of SOI layer regions 30-C and 30-B are implanted with ion species 25 (via ion implanter system 110) to cause amorphization with those SOI layer regions. Ion implanter system 110 may implant ion species 25 substantially similarly as described with reference to FIG. 2B, and in this case, may implant only in those portions of semiconductor structure 15 not protected by mask 45. This may cause differences in amorphization between SOI layer regions 30-A, 30-B, 30-C and within SOI layer regions (30-B).

Figure 3C:
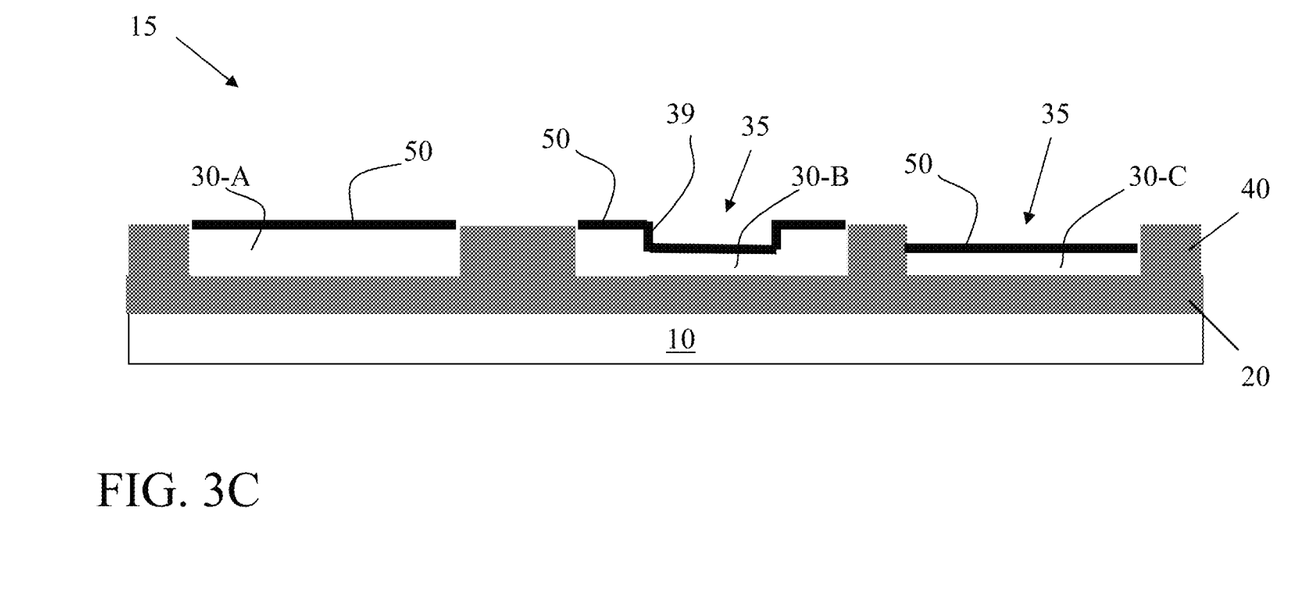

Turning to FIG. 3C, semiconductor structure 15 is shown after removal of portions of amorphized SOI layer regions 30-B, 30-C to form recesses 35, removal of mask 45 and formation of oxide cap 50. These processes may be performed using substantially similar systems as those described with reference to FIG. 2C. Further, polishing/etching system 112 may be used to remove mask 45, if desired. Removal of portions of amorphized SOI layer regions 30-B, 30-C to form recesses 35 may be performed substantially similarly as described with reference to FIG. 2C (e.g., CMP, RIE, etc. via polishing/etching system 112). It is understood that portions of SOI layer regions which have not been amorphized (30-A, portions of 30-B) may be removed dissimilarly to those portions that have been amorphized (30-C, portions of 30-B). For example, in one embodiment, SOI layer region 30-A may not be amorphized, and only a nominal portion of SOI layer region 30-A may be removed during a CMP and/or RIE process.

In one embodiment, removal of portions of amorphized SOI layer regions 30-B, 30-C may be performed using RIE. RIE may be performed, for example, before removal of mask 45 to allow for cleaning of discontinuities between edges 39 within SOI layer region 30-B. However, RIE may be used after removal of mask 45 as well. Polishing/etching system 112 may remove mask 45 by any conventional means, which may vary depending upon the material properties of mask 45. In any case, after removal of mask 45 and portions of SOI layer regions 30-A, 30-B, 30-C that have been amorphized, semiconductor structure 15 may be annealed (via annealing system 114) substantially similarly as described with reference to FIG. 2C. After annealing semiconductor structure 15, oxidizing system 116 may form an oxide cap 50 over one or more of SOI layer regions 30-A, 30-B, 30-C.

In any case, SOI layer regions 30-A, 30-B, 30-C may each have an average thickness distinct from one another. That is, using mask 45, SOI layer regions 30-A, 30-B and 30-C may be exposed to different amounts of ion implantation, and consequently, differing degrees of amorphization. These differing degrees of amorphization may result in different sized recesses 35 having different profiles. In one embodiment, region 30-A may have a thickness of approximately 60-100 angstroms, region 30-B may have a thickness of approximately 25-60 angstroms, and region 30-C may have a thickness of approximately 5-25 angstroms. In one embodiment, as shown with reference to SOI layer region 30-B, foundations of a raised source/drain region (regions of non-uniform thickness) may be formed using the techniques described herein. In this case, raised source/drain region (indicated by edges 39) may have a thickness greater than approximately 25-60 angstroms. These raised source/drain regions may aid in the subsequent formation of a variety of semiconductor devices known in the art.

The methods and structures as described above are used in the fabrication of semiconductor chips. The resulting semiconductor chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An extra-thin semiconductor-on-insulator (ETSOI) layer comprising:
   a plurality of shallow trench isolations (STI) defining a plurality of distinct semiconductor-on-insulator (SOI) regions, the distinct SOI regions having at least three different thicknesses;
   a plurality of recesses located within the distinct SOI regions; and
   an oxide cap over each of the plurality of recesses,
   wherein the at least three different thicknesses include: a first thickness of approximately 60-100 angstroms, a second thickness of approximately 25-60 angstroms, and a third thickness of approximately 5-25 angstroms,
   wherein the plurality of STIs are located over a portion of a buried insulator layer, and the plurality of distinct SOI regions are located over a distinct portion of the buried insulator layer than the plurality of STIs, and
   wherein each of the plurality of distinct SOI regions is located in a same lateral layer overlying the buried insulator layer, wherein one of the plurality of recesses has a distinct profile than a distinct recess in the plurality of recesses.

2. The ETSOI layer of claim 1, further comprising a raised source/drain region located between at least two of the plurality of STI, the raised source/drain region located within the region having a thickness of approximately 25-60 angstroms.

3. The ETSOI layer of claim 2, wherein the raised source/drain region aides in subsequent formation of a semiconductor device.

4. The ETSOI layer of claim 2, wherein the raised source/drain region includes a vertical edge between the at least two of the plurality of STI.

5. The ETSOI layer of claim 1, wherein the recess with the distinct profile includes a stepped profile within the corresponding SOI region, wherein the recess with the stepped profile is surrounded by its corresponding SOI region.

6. An extra-thin semiconductor-on-insulator (ETSOI) layer comprising:
   a plurality of shallow trench isolations (STI) defining a plurality of distinct semiconductor-on-insulator (SOI) regions, the distinct SOI regions having at least three different average thicknesses, wherein the distinct SOI regions are all located within a common layer of the ETSOI;
   a plurality of recesses located within the distinct SOI regions; and
   an oxide cap over the plurality of recesses,
   wherein the at least three different average thicknesses include: a first average thickness of approximately 60-100 angstroms, a second average thickness of approximately 25-60 angstroms, and a third average thickness of approximately 5-25 angstroms,
   wherein the plurality of STIs are located over a portion of a buried insulator layer, and the plurality of distinct SOI regions are located over a distinct portion of the buried insulator layer than the plurality of STIs, and
   wherein each of the plurality of distinct SOI regions is located in a same lateral layer overlying the buried insulator layer, wherein one of the plurality of recesses has a distinct profile than a distinct recess in the plurality of recesses.

7. A semiconductor structure comprising:
   a substrate;
   a buried insulator layer overlying the substrate; and
   an extra-thin semiconductor-on-insulator (ETSOI) layer overlying the buried insulator layer, the ETSOI layer including:
   a plurality of shallow trench isolations (STI) overlying a portion of the buried insulator layer, the plurality of STIs defining a plurality of distinct semiconductor-on-insulator (SOI) regions overlying distinct portions of the buried insulator layer than the plurality of STIs, the distinct SOI regions having at least three different thicknesses;
   a plurality of recesses located within the distinct SOI regions; and
   an oxide cap over the plurality of recesses,
   wherein the plurality of distinct SOI regions are all located within a common layer of the ETSOI overlying the buried insulator layer,
   wherein one of the plurality of recesses has a distinct profile than a distinct recess in the plurality of recesses.

8. The semiconductor structure of claim 7, wherein the common layer of the ETSOI is a single, laterally extending layer.

9. The semiconductor structure of claim 8, further comprising a raised source/drain region located between at least two of the plurality of STI.

10. The semiconductor structure of claim 9, wherein the raised source/drain regions aides in subsequent formation of a semiconductor device.

11. The semiconductor structure of claim 9, wherein the raised source/drain region includes a vertical edge between the at least two of the plurality of STI.

12. The semiconductor structure of claim 7, wherein the distinct SOI regions having the at least three distinct thicknesses are formed by masking and etching of at least a portion of one of the distinct SOI regions, and by the masking and etching a distinct portion of a distinct one of the distinct SOI regions.

* * * * *